(12) United States Patent
Nyshadham et al.

(10) Patent No.: US 8,502,546 B2
(45) Date of Patent: Aug. 6, 2013

(54) MULTICHANNEL ABSORBERLESS NEAR FIELD MEASUREMENT SYSTEM

(75) Inventors: Adiseshu Nyshadham, Calgary (CA); Ruska Patton, Calgary (CA); Jason Jin, Calgary (CA)

(73) Assignee: Emscan Corporation, Calgary, Alberta (CA)

( * ) Notice: Subject to any disclaimer, the term of this patent is extended or adjusted under 35 U.S.C. 154(b) by 401 days.

(21) Appl. No.: 12/745,182

(22) PCT Filed: Oct. 10, 2007

(86) PCT No.: PCT/CA2007/001810
§ 371 (c)(1),
(2), (4) Date: Apr. 21, 2011

(87) PCT Pub. No.: WO2009/046516
PCT Pub. Date: Apr. 16, 2009

(65) Prior Publication Data
US 2011/0193566 A1  Aug. 11, 2011

Related U.S. Application Data

(63) Continuation-in-part of application No. 11/686,983, filed on Mar. 16, 2007, now Pat. No. 7,672,640.

(60) Provisional application No. 60/744,316, filed on Apr. 5, 2006.

(51) Int. Cl.
G01R 27/04 (2006.01)

(52) U.S. Cl.
USPC .......................................... 324/637

(58) Field of Classification Search
USPC .................................. 324/637, 762.01–762.1
See application file for complete search history.

(56) References Cited

U.S. PATENT DOCUMENTS

| 4,378,559 | A | * | 3/1983 | Rittenbach | 342/374 |
| 5,229,776 | A | | 7/1993 | Kelly et al. | |
| 5,243,352 | A | * | 9/1993 | Sezai | 342/382 |
| 5,270,723 | A | | 12/1993 | Lopez et al. | |
| 5,675,343 | A | * | 10/1997 | Champeau | 342/378 |
| 6,166,705 | A | | 12/2000 | Mast et al. | |
| 6,208,287 | B1 | | 3/2001 | Sikina et al. | |

(Continued)

FOREIGN PATENT DOCUMENTS

| EP | 0665447 | 8/1995 |
| WO | 2009046516 | 4/2009 |

OTHER PUBLICATIONS

Petre, Peter et al.; Planar Near-Field to Far-Field Transformation Using an Array of Dipole Probes; IEEE Transactions on Antennas and Propagation; Apr. 1994; vol. 42, No. 4; pp. 534-537.

(Continued)

Primary Examiner — Tung X Nguyen
(74) Attorney, Agent, or Firm — Bennett Jones LLP

(57) ABSTRACT

A near field microwave scanning system includes a switched array of antenna elements forming an array surface, a scan surface substantially parallel to the array surface and separated by a distance less than about 1 wavelength of the measured frequency, and a processing engine for obtaining and processing near field data, without the use of an absorber.

13 Claims, 10 Drawing Sheets

U.S. PATENT DOCUMENTS

| | | | |
|---|---|---|---|
| 6,686,873 | B2 | 2/2004 | Patel et al. |
| 6,750,822 | B2 | 6/2004 | Fritzel |
| 6,762,726 | B2 | 7/2004 | Alden et al. |
| 6,771,216 | B2 | 8/2004 | Patel et al. |
| 6,919,845 | B2 | 7/2005 | Ozaki et al. |
| 7,130,755 | B2 | 10/2006 | Lee et al. |
| 7,186,377 | B2 | 3/2007 | Lyama et al. |
| 7,222,033 | B1 | 5/2007 | Newson et al. |
| 7,268,564 | B2 | 9/2007 | Ozaki et al. |
| 7,280,077 | B2 | 10/2007 | Woo et al. |
| 2007/0285322 | A1 | 12/2007 | Nyshadham et al. |

OTHER PUBLICATIONS

Bolomey, Jean-Charles et al.; Rapid Near-Field Antenna Testing via Arrays of Modulated Scattering Probes; IEEE Transactions on Antennas and Propagation; Jun. 1988; vol. 36, No. 6; pp. 804-814.

Yaghijan, Arthur D.; An Overview of Near-Field Antenna Measurements; IEEE Transactions on Antennas and Propagation; Jan. 1986; vol. 34, No. 1; pp. 30-45.

EMSCAN Corporation; EMI Scanning Solutions and Assessment Tools to Help You Solve EMC Design Problems in a Single Design Cycle; Calgary, Canada—Brochure.

\* cited by examiner

MULTICHANNEL ABSORBERLESS NEAR FIELD MEASUREMENT SYSTEM

CROSS REFERENCE TO RELATED APPLICATIONS

This application is the National Phase of International Application No. PCT/CA2007/001810, filed Oct. 10, 2007, which is related by continuation or continuation-in-part to U.S. patent application Ser. No. 11/686,983, filed on Mar. 16, 2007, now U.S. Pat. No. 7,672,640, which claims the priority benefit of U.S. Provisional Patent Application No. 60/744,316 filed on Apr. 5, 2006, the contents of which are incorporated herein by reference.

FIELD OF THE INVENTION

The present invention is directed to the measurement, testing and verification of performance parameters of electromagnetic radiating devices.

BACKGROUND OF THE INVENTION

Performance parameters of electromagnetic radiating devices include Effective Isotropic Radiated Power (EIRP) and Effective Radiated Power (ERP), radiation pattern, directivity, RF current distribution of mounting surfaces and magnetic near field distribution. Such radiating devices may include multimode, multiband, or multiple input/multiple output (MIMO) radiating devices, such as for example, cellular phones, and wireless transceivers including WiFi gear, and wireless PDA's and laptop computers.

When cellular phones or other radiating devices are manufactured, they must be calibrated to transmit a known RF power (galvanic power) from the transmitter to the antenna structure, as well as to radiate known RF power (EIRP/ERP) from the antenna structure. The power measurement and verification also must be performed at various levels throughout the operating range of the radiating device. This measurement and verification ensures that the highest power transmitted to and from the antenna produces legal and acceptable specific absorption rate (SAR), for a given EIRP/ERP limit. As well, the power measurement and verification assists in maintaining a valid wireless link in cellular communications while minimizing power usage, thereby extending battery life, and maximizing coverage and capacity of the cell sector.

Conventionally, a sample of every cell phone model to be retail marketed is tested for the maximum EIRP/ERP Level in a test lab for several hours, with a considerably large measurement uncertainty of greater than 2.0 dB. Before performing this test, the galvanic power of the cell phone must be calibrated and the cell phone is set to radiate with maximum galvanic power.

The cell phone RF power is conventionally delivered to the cell phone test set using a physical hardwired connector just before the antenna section of the RF circuit, and is adjusted via a cable connection between the RF connector on the cell phone and test set. Once the maximum EIRP/ERP level is adjusted or found to meet regulatory limits for a given galvanic power, then only the SAR level measurements are performed for legal compliance.

To measure and verify the RF power of a cell phone or other radiating devices having more than one antenna, as well as for devices with MIMO architecture, the manufacturer usually provides a single RF connector along with an RF switch, filter and impedance matching for each antenna circuit. As the RF connector is well before the RF switch, filter and matching circuits, the performance of each of the antenna circuit is unknown even after successfully completing all the manufacturing tests of the cell phone using the conventional method.

While performing the SAR measurement, the maximum galvanic power level obtained in the first step is used as the starting level. If the galvanic power requires adjustment to meet the SAR limits, the adjusted galvanic power level will be considered the maximum power that can be fed to the antenna, and then EIRP/ERP levels must be re-evaluated.

Most manufactured cell phone (or radiating device) samples of the same model are calibrated using the new galvanic power level as the maximum power to the antenna. Once this maximum level is measured and verified, up to 20 intermediate power levels are set and measured throughout the dynamic range. In order to perform these measurements, a galvanic RF link is established using a cable between the cell phone RF connector and the test set. The RF connector of the cable for the cell phone connection end wears out over time and is replaced based on an estimated maximum number of insertions during the manufacturing test cycle for all produced units (usually very large). Production testing is stopped and a new cable must be introduced and a recalibrated before manufacturing testing can resume. This introduces delay and cost.

After each cell phone is measured and verified for appropriate galvanic RF power levels in order to meet the legal EIRP/ERP as well as SAR levels, each cell phone is further tested for Tx and Rx performance. To perform this test, the cell phone is connected to the cell phone tester using an RF cable between its RF connector and test equipment as discussed above. In the majority of the cases, the RF power measurement and verification is done in one location and the Tx/Rx parametric testing is done in another location. In the event these tests are performed at different locations, the RF cable connected between the cell phone and test set must be replaced frequently with a new RF cable due to the large number of insertions. A recalibration of the RF cable must be performed before continuing the manufacturing Tx/Rx parametric testing of cell phones which introduces further delay and cost.

During board level manufacturing or designer testing to optimize the RF parameters of cell phones, the measurements are performed with an RF galvanic connection. This method does not provide all the necessary measurements to understand the complete performance of the RF circuit.

During the design and development of radiating devices, designers often go though a series of iterations to improve the radiated performance of the antenna model(s) for achieving greater usable range, both in frequency and sensitivity, while targeting low SAR levels and low galvanic RF power. Each time the radiated performance of the radiating device is measured, it is necessary to go to the test labs where EIRP/ERP levels can be optimized through a series of measurements. Currently no tool exists for finding accurate spatial distribution of the RF radiation in the near field to minimize unwanted radiation. Designers rely on the conventional testing methods in the test labs for far field radiated patterns and then debug at the circuit board level, which is a very tedious and complicated process.

For measuring antenna properties such as radiation pattern, gain, and directivity, near field scanners are employed to gather accurate amplitude and phase data and subsequently to calculate the equivalent far field value using one of many transformations known and available in the prior art. To accurately estimate the far field, those skilled in the art believe the measurement distance between the probe and antenna under test should be greater than or equal to one wavelength. Current near field testing is performed using a mechanical scanner with a single compensated probe which can detect both polarizations. These measurements usually take more than a few hours to complete a scan of the entire radiating surface.

When near field radiation is measured, the array elements and conducting planes and dielectric medium around them have considerable effect on the near field distribution of the radiating source as well as its far field properties. In the prior art, using multi-axis near field measurement systems, the measurement is performed at greater than one wave length from the antenna under test in order to minimize the ground plane effect which is then accounted for relatively easily. The array sensitivity is decreased and the measurement dynamic range is limited. Furthermore, measurement speed and physical size make this an impractical approach in a high speed production test environment or in a traditional development lab where real time feedback and the effective use of physical lab space is highly valued.

In another approach, a perfect near field absorber such as that described in U.S. Pat. No. 6,762,726 B2, issued Jul. 13, 2004, is used to increase the isolation between the radiating and array surfaces thus decreasing the mutual coupling effects which will distort the measured field strength of the electromagnetic radiation emitted from the circuitry transmitting the signal. The array sensitivity is significantly decreased, and the measurement dynamic range is limited. Furthermore, the probe density described, and the required attributes and performance of the added physical absorber solution add tremendous complexity, sustainable yield challenges, and cost to deploying a physically realizable solution. With the addition of a physical absorber, the interaction between radiating source and the absorber surface still exists and results in a modified near-field representation of the radiating source.

There is a need in the art for method and apparatus of measuring performance such as EIRP and ERP from electromagnetic radiating devices using near field measurement techniques that addresses the limitation of the solutions referenced.

SUMMARY OF THE INVENTION

The present invention comprises a novel multi-channel near field scanning system for measuring performance parameters such as EIRP/ERP and generating far field patterns of electromagnetic radiating devices through a range of input power levels. Preferably, the scanning system is also transparent for accurate and repeatable measurement of roundtripTx/Rx performance. In at least one embodiment, this system is effective without the need for a galvanic RF connection. A radiating device such as a multimode, or multiband, or MIMO (or combinations thereof) mobile or cellular phone is placed on a scanner of finite area at distances equal to or smaller than about $1/1.8^{th}$ of a wavelength of the operating frequency of the radiating source. Preferably, the distance is about $1/1.8^{th}$ to about $1/88^{th}$ of the wavelength, over a frequency range of about 8 GHz to about 170 MHz. A multichannel electromagnetic scan is performed in real time using an electronically switched array of probes, and the near field amplitude and phase of both the x and y components of the radiating source are measured, corrected, re-measured and displayed. Using the corrected near field data, far field transformations and radiating source models, performance parameters such as the EIRP/ERP, directivity and radiation pattern of the radiating device are estimated and displayed.

Due to its real time scanning speeds and accurate near and far field measurement capability, embodiments of the present invention may be used to rapidly test in a production environment or to characterize the radiating devices, to measure the RF current distribution on mounting surfaces of antennas, to improve RF circuits, to debug and locate faulty antennas or sub-arrays or arrays and to optimize antenna performance.

Embodiments of the present invention may also measure the Tx./Rx performance of a radiating source without the need for a galvanic RF connection. The radiating device, which may be a multimode and/or multiband and/or MIMO mobile or cellular phone, is placed on the scanner at distances smaller than one wavelength, preferably $1/1.8^{th}$-$1/88^{th}$ of one wavelength, of the operating frequency of the radiating source. Two distinct and optimum RF channels of the near field scanner are selected and are assigned to Tx and Rx modes of the transceiver. Using an external test set, the Tx and Rx performance of transceiver is evaluated.

Therefore, in one aspect, the invention may comprise an absorberless multichannel near field microwave scanning system comprising:

(a) a switched array of antenna elements embedded in a dielectric, for sensing electromagnetic field components at pre-determined locations, and forming an array surface, wherein said array outputs raw uncorrected signals which are indicative of the electromagnetic field and which include mutual coupling effects;

(b) a scan surface for placement of the device under test (DUT), wherein the scan surface is substantially parallel to the array surface and separated by a distance less than about $1/1.8^{th}$ of the wavelength of the measured frequency;

(c) a processing engine operatively connected to the switched antenna array for obtaining and processing the array output, said processing engine adapted to correct at an individual probe level for mutual coupling effects.

In one embodiment, the mutual coupling effects include reflections and dynamic coupling effects between individual antenna elements across the array, and close array to DUT proximity effect. As well, the finite scanner size may also affect the far field transformation and is accounted for in the processing engine.

In one embodiment, the processing engine comprises:
i. a controller,
ii. a channel selector and sampler,
iii. a channel corrector, to precisely adjust for differential path losses and delays;
iv. a data translator and interpolator,
v. an amplitude and phase detector,
vi. a near field corrector, to correct at an individual probe level for reflections, and dynamic coupling between individual antenna elements across the array
vii. a transformer for transforming the near field data to far field patterns and design performance parameters, and
viii. a user interface.

In another aspect, the invention may comprise an absorberless method of measuring EIRP/ERP or Tx/Rx performance of RF and microwave transceiver, said method comprising the steps of:

(a) using a switched array of antenna elements forming an array surface;

(b) using a scan surface, wherein the scan surface is substantially parallel to the array surface and separated by a distance less than about one half wavelength of the measured frequency;

(c) generating near field data by receiving output from each antenna which is indicative of an electromagnetic field but includes mutual coupling effects and effects due to finite scanner size;

(d) correcting near field data to correct at an individual probe level for reflections and mutual coupling effects across the array; and (e) transforming the near field data to far field data.

In one embodiment, the mutual coupling effects include reflections and dynamic coupling effects between individual antenna elements across the array and the close array to DUT proximity effect.

BRIEF DESCRIPTION OF THE DRAWINGS

The invention will now be described by way of an exemplary embodiment with reference to the accompanying simplified, diagrammatic, not-to-scale drawings. In the drawings.

DETAILED DESCRIPTION OF THE INVENTION

The present invention provides for a method and apparatus for measuring radiated power of a radiating source in the near field. When describing the present invention, all terms not defined herein have their common art-recognized meanings. The term "about" when used in combination with a numerical value, shall mean the value includes a range of 10% above and below the stated value or within the known tolerances of the methods of measuring the value. The term "near field" means the field within a distance from the antenna less than or equal to about one wavelength of the radio frequency being radiated. Where permitted, the references listed herein are incorporated herein as if reproduced in their entirety.

Figure 1:
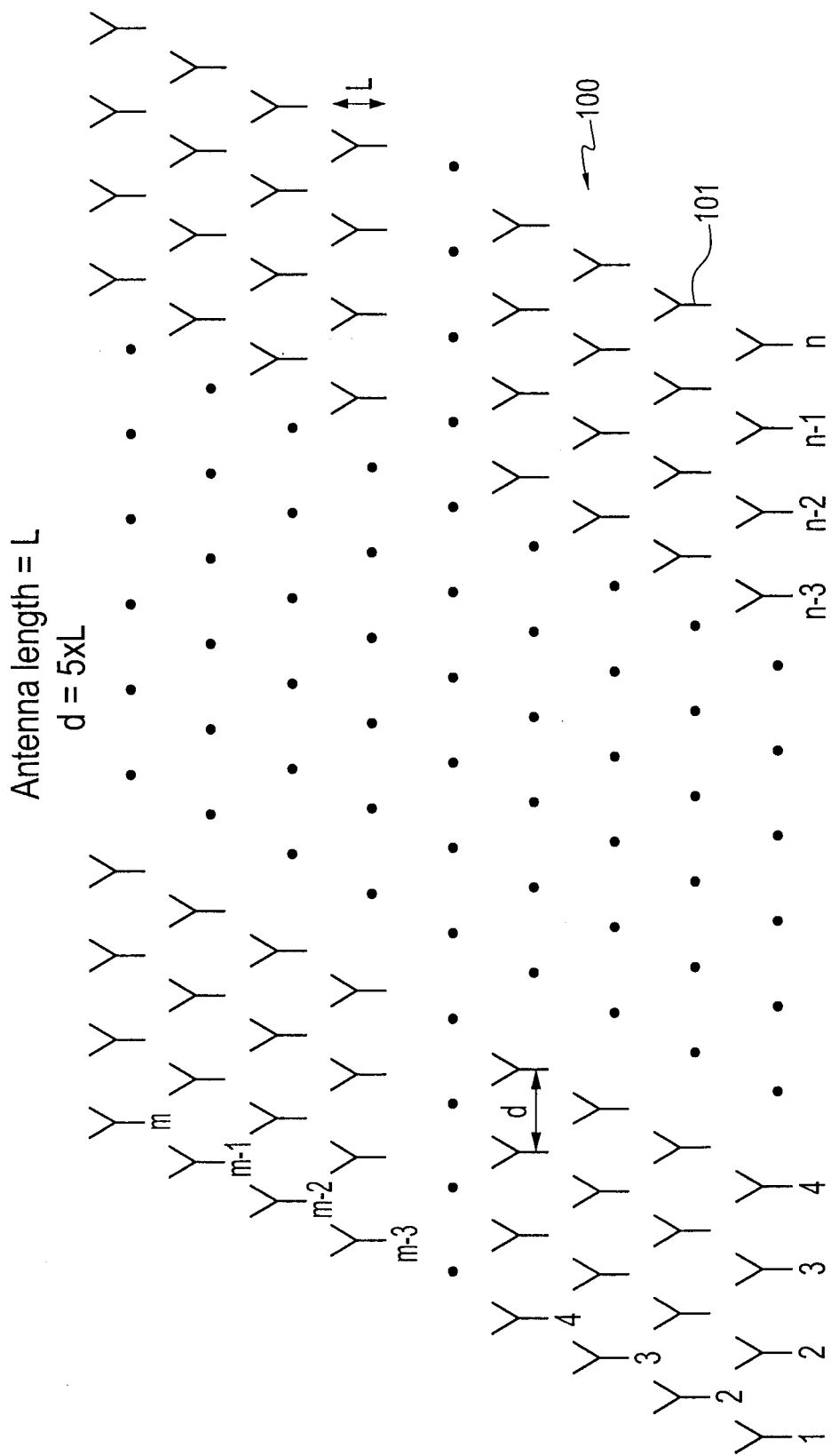
FIG. 1 is a schematic representation of the antenna array of a scanner.

The present invention comprises an absorber-less microwave near field scanner. In one embodiment, the scanner (100) includes a plurality of antennas (101) arrayed in a two-dimensional array capable of transmitting or receiving electromagnetic radiation. The antennas are preferably, but not necessarily, half loop antennas. As shown in FIG. 1, the array may have m elements in the x-axis, and n elements in the y-axis. In one embodiment, the loop dimensions length (L) and depth are optimized to provide sufficient discrimination between H-Field intensity and E-Field intensities. For a given scan area and radiated power accuracy, the inter element spacing (d) and the total number of array elements are determined. In one embodiment, m may be 24 while n may be 16, while d may equal about 10 mm. In one embodiment, d may equal about 5 L. A greater number of antennas within given area (ie. smaller values of d) will provide greater accuracy, however, at a cost of increased mutual coupling effects between antennas and their feed structures.

Figure 2:
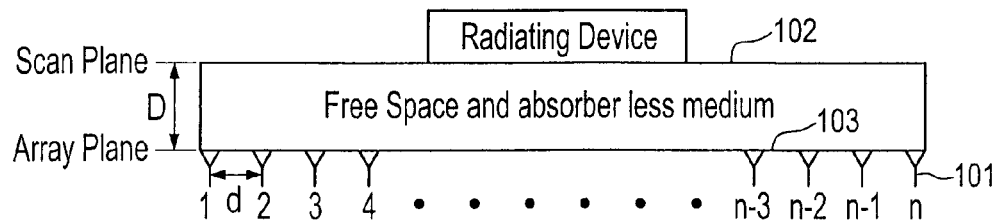
FIG. 2 is a side view of the antenna array and the scan plane.

As shown in FIG. 2A, the scan plane (102) is placed at a distance (D) from the array surface (103) with the preferred range of about $1/88^{th}$ to about $1/1.8^{th}$ of wavelength and the corresponding inter element distance (d) range of the array is preferably about $1/176^{th}$ to about $1/3.6^{th}$ of wavelength. If D is such that the scan plane is too close to the array surface, the array surface may be within the very reactive near field, as shown in the FIG. 6, with negative consequences. However, as D gets larger, the size of the array must be increased to obtain the same scan energy. In one embodiment, D/d may be about 2.0.

The embodiment illustrated shows a substantially planar scan plane and antenna array, which are substantially parallel to each other. Alternative embodiments may include spherical, cylindrical or other geometrical scan surfaces.

Figure 3:
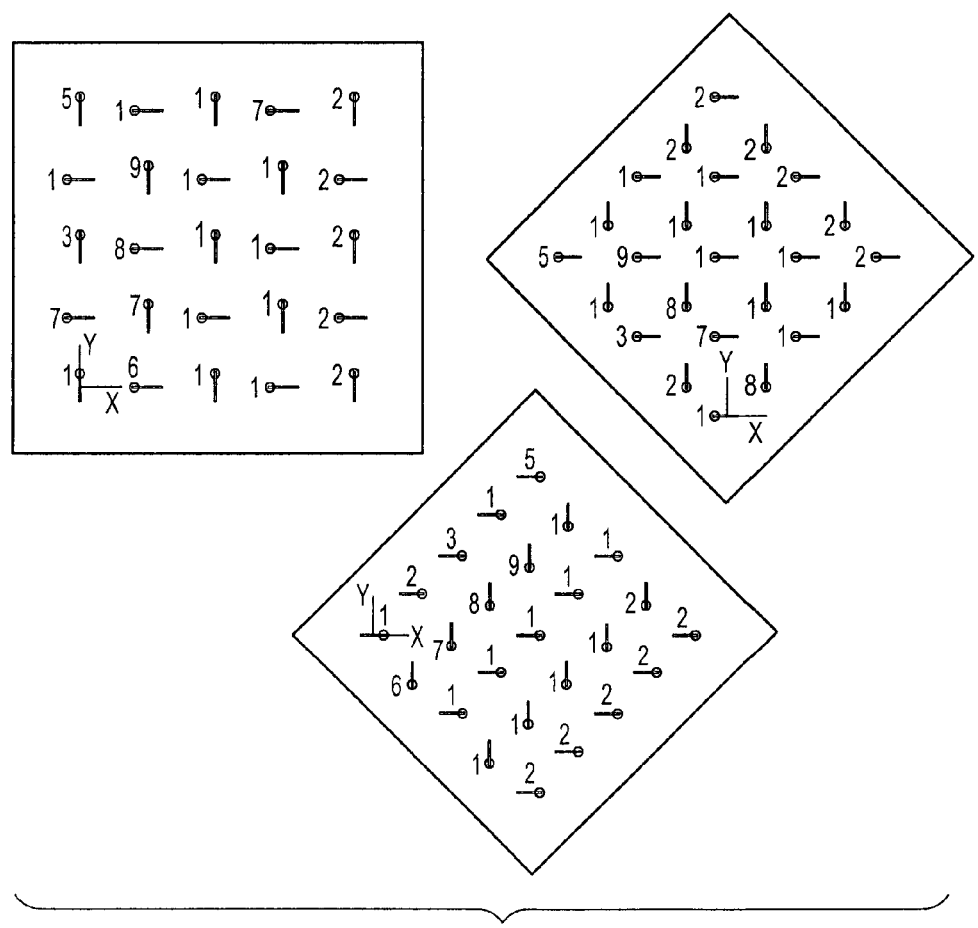
FIG. 3 shows alternative arrangements of a half-loop antenna array.

The typical layout of the half loops (101) is such that the successive array elements transmit or receive the orthogonal polarizations of H field intensity. Alternative layout arrangements can also be used with this scanner or array, including those arrangements shown in FIG. 3.

The outputs from the array antennas are fed through a backplane to the secondary side of a multilayer printed circuit board (PCB). The PCB layer stack and layout should preferably be able to provide an element-to-element isolation better than 20 dB over the frequency range of interest. In one embodiment, the one end of the half loop antenna (101) is connected to a ground plane immediately adjacent the antenna layer, and other end of the half loop antenna is connected to a microstripline layer through a feed via, without matching.

Figure 4:
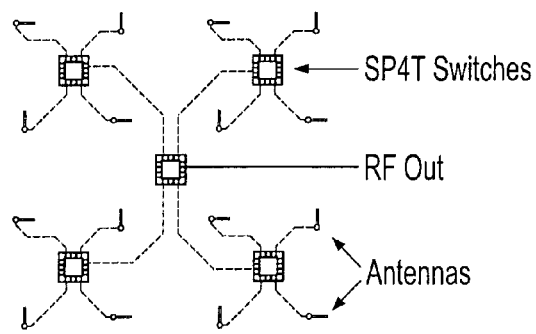
FIG. 4 shows a two-layer switch array.

The output from a specific antenna (101) is selected by means of switches (110) which can select the output from any one of the antenna elements (101). Because the large number of antenna elements makes a single switch for each antenna difficult to implement, one embodiment of the invention comprises a system of layered switches, which permits the use of a relatively small number of switches. In one example, using 3 layers of SP4T switches, the number of signals can be reduced by a factor of 64. Thus, a 384 element array can be reduced to 6 RF outputs. A module of 16 elements with two layers of switches is in FIG. 4.

Along with the switch matrix, a second channel is connected to one antenna element to provide a reference signal. This reference signal is necessary to make relative phase measurements. The architecture of antenna array is such that it is expandable to simultaneous radiated power measurement of more than one radiating surface or device by appropriately selecting a pair of channels.

A selected and a non-selected antenna should preferably be adequately isolated from each other. Poor isolation phenomena is typically due to leakage in the cavity formed by adjoining ground planes, such that the antenna feed vias extend conduction of the antenna currents through the inner layers to the component layer, making the feed via an effective radiator.

Measurement and simulation of antenna isolation in a two layer board showed very good isolation. As a result, we believe that the coupling was not due to the antenna structure and was not present with only one ground layer. When the simulation model was changed to include more than two ground layers, significant leakage was observed. Power would flow from one via to the next in the substrate between the ground layers with very little attenuation.

A coaxial feed may provide excellent isolation in theory, however, a coaxial feed may be difficult to manufacture. A more practical solution may be to implement with ground via or ground ties. Therefore, in one embodiment, the PCB includes isolation means consisting of a ground via (or a ground tie) connecting all the ground layers together. We have found that positioning the ground tie closer to the feed via produces better isolation, and using multiple ground ties also produces better isolation.

The processing engine accepts antenna signals from the scanner PCB, referred to herein as near field data, and processes them to provide useful information. The antenna signals include mutual coupling effects such as reflections and dynamic coupling between individual antenna elements across the array, and the proximity of the device-under-test (DUT) to the array, as well as effects related to the finite scanner size, both physical and virtual. Therefore, in one embodiment, the processing engine provides means for removing or minimizing mutual coupling effects at the individual probe level. The processing engine also accounts for the close array to DUT proximity effect, and further accounts for a finite virtual scanner size through the transformation to far field using a plane wave spectrum (PWS) model.

Figure 5A:
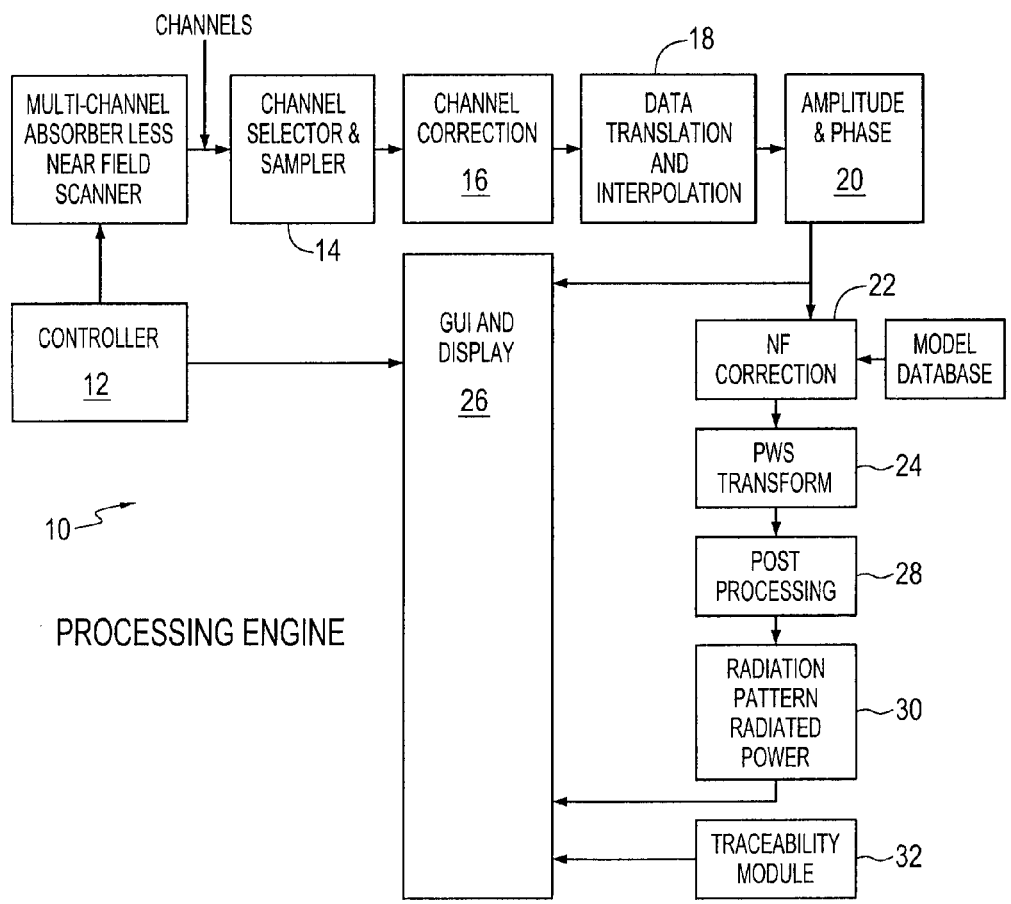
FIG. 5A shows a schematic depiction of the processing engine.
Figure 5B:
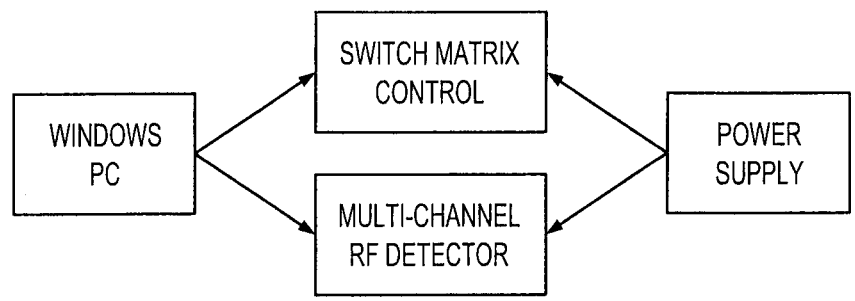
FIG. 5B shows a schematic representation of the controller function.
Figure 5C:
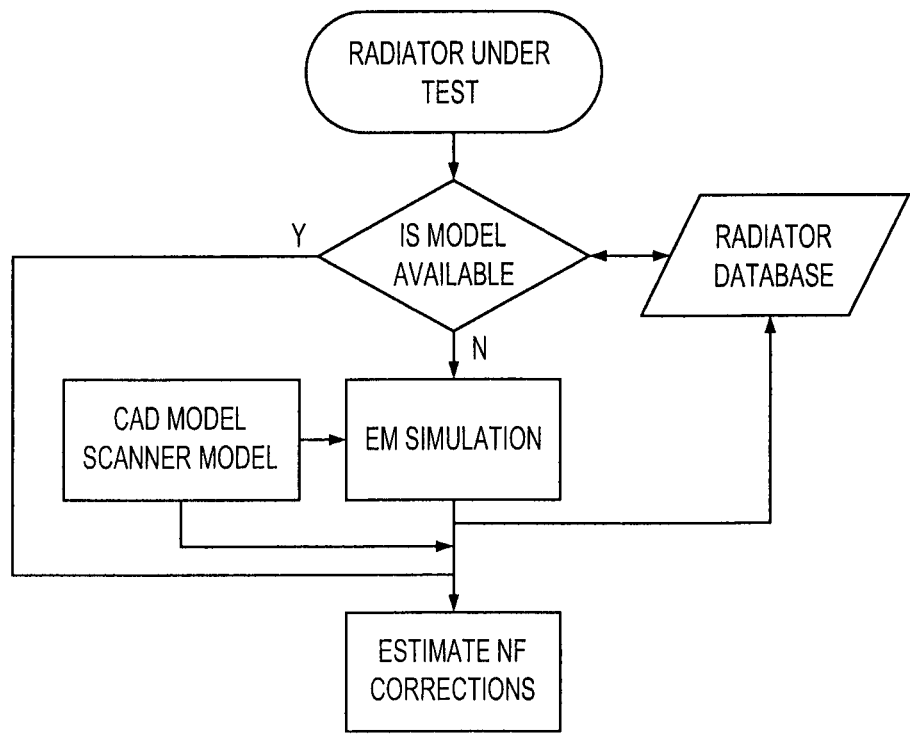
FIG. 5C shows a schematic flowchart depicting near field correction.

In one embodiment, as shown schematically in FIG. 5, the processing engine (10) comprises a controller (12), a channel selector and sampler (14), a channel corrector (16) to precisely adjust for differential path losses and delays, a data translator and interpolator (18), an amplitude and phase detector (20), a near field corrector (22), a transformer for transforming the near field data to far field data (24), and a user interface including a graphics card or other means for driving a display (26). The processing engine may also include a post-processor (28) and means for determining EIRP (30). A traceability module (32) is optional. The components of the processing engine may be implemented in software, firmware, hardware, or any combination thereof, as is well-known in the art.

As shown in FIG. 5B, the controller (12) functions primarily to supply power to the rest of the system and to control the switches and attenuators on the PCB. The controller (12) receives commands from the operating processor, which may be a desktop or laptop computer, and translates this data into the signals required to operate the antenna board and the signal conditioning section. The control board inputs are connected to the I/O on the computer. The input lines are used for data transfer of state control signals as well as routing signals, which will cause the proper state control to go to the proper output data lines.

To have complete control over the state of the antenna board and the signal conditioning system, and to obtain accurate measurements across the required dynamic range, two sets of inputs are required. One of the bits on the input is dedicated to the group select of the input. The feedback and delay section is necessary to handle the handshaking requirements of the I/O card. This section is also used to generate the CLK signal.

The ACK signal is sent from the I/O card and requires a REQ to be returned before the card will output the next set of data. The REQ signal must have a certain minimum delay and duration. This handshaking requirement is met by a simple feedback and delay circuit. The REQ delay is introduced by passing the ACK signal through two inverters implemented using NAND gates. A CLK signal is also introduced into the system using the two inverter approach.

Since the total output data lines required from the power and control board are many (38 lines in the embodiment shown), some form of de-multiplexing or decoding is needed and in a preferred embodiment, both strategies are employed on the board. Suitable demultiplexing and decoding strategies are well-known to those skilled in the art.

The user interface and display (22) may display data on a conventional computer monitor, and accept user inputs via a computer keyboard, and mouse, as is well known in the art. In one embodiment, the user interface is a graphical user interface (GUI) and the display architecture is designed to provide flexibility to feed test parameters such as selection of the scan area, reference probes, scan type, selection of models, frequency range and loading the data such as raw data, DAQ corrected data, probe corrected data, translated data, path corrected data and reference far field data. Once all test parameters are loaded, the GUI and display section (22) of the processing engine (10) interprets the loaded test parameters and create a test sequence and starts executing each test sequence with the help of the controller while simultaneously measuring/logging the scan data to a computer memory. Additionally or optionally, the scan data may be written to a hard drive or other data storage device for further processing.

The scan data is then further processed to determine at least one performance parameter such as the 2D and 3D component specific near field distribution, total near field distribution, amplitude and phase distribution, far field pattern in principle cuts and for any desired cuts, as well as ERP, EIRP and directivity in real time.

In a two channel system, the channels are designated as reference and measurement channels respectively. In one embodiment, the reference channel is connected to an unique element of the array, however, it can also be reconfigured to connect to different elements of the array which may be determined dynamically by the controller, based on the scanned information or input parameters. In one embodiment, the system architecture enables to select a pair of antenna elements of the array and connects them to reference and measurement channels simultaneously.

In one embodiment, both the reference and measurement input channels are mixed down to an intermediate frequency (IF). The IF signals are further amplified and processed through band pass filters. These filters will determine the frequency range of the IF, so in order to cover the full measurement frequency range, the local oscillator (LO) will need to be programmed to generate the correct IF range. The full input frequency range will be broken down into N segments equal in width to the IF filter bandwidth. Preferably, the LO would be designed to only cover the frequency regions of interest, that is the cellular bands. For the reference channel, the log amplifier will determine the peak or averaged peak amplitude. The limiter output from the log amplifier will be passed through a comparator and into a counter that will determine the signal frequency. On the measurement channel, an additional switchable attenuator will be used after the amplifier in order to increase the range of the allowable input signal strength. An RMS detector will measure the amplitude of the measurement channel. Optionally, the same detector could also be used to determine the peak amplitude. Using both detectors, it is possible to detect and measure the signal strength of the received modulated RF energy with various modulation formats.

For the phase measurement, two phase detectors may be used. One will input the reference and measurement channels directly from the IF filters, while the other will have a 90 degree phase delay filter on the reference channel.

A microprocessor will control and read the measurements from the associated A/D converters and the counter. It will communicate with the processing engine to determine the input frequency band and other necessary information, and it will transmit the signal measurements to the processing engine. To achieve the required precision, the A/D converters should preferably have a minimum of 10 bits of resolution.

The sample rate should preferably be at least 1 MSPS, although having a faster sample rate will likely reduce the required time to make all required measurements and allow for some averaging of the data as well.

The amplitude and phase measured by the RF sampler is in a raw state to which various corrections are applied to create an accurate data set of the scan plane. Initially, the RF sampler amplitude and phase correction is applied at a given frequency and for a given temperature. Subsequently, path loss correction is applied to both amplitude and phase at a given frequency and for a given temperature. Lastly, the corrected amplitude and phase data is converted to field quantities by applying antenna factor correction.

As each element of the antenna array measures only one magnetic field component orthogonal to that of its adjacent one, interpolation is applied in order to get both transverse components at each sampling point of the scan plane. For amplitude, interpolation is implemented by averaging its four adjacent measured points. For edge elements, data is interpolated from its adjacent three elements. For corner elements, data is interpolated from its adjacent two elements. In one embodiment, phase interpolation may be achieved by a three points method. First, the 4 adjacent data points are sorted from minimum to maximum. If the phase difference between the sorted adjacent data points is larger than a pre-determined threshold value, the most unique one is discarded and the remaining three points are averaged. Otherwise, the four adjacent measured points are averaged. Preferably, special treatments for edge points and 4 corners may be used in order to get better results. Alternatively, extrapolation from internal points is adopted for those points.

In the amplitude and phase detection module (20), after the raw data is passed through the correction and interpolation stages, the amplitude and phase of the near field data is available for further processing display and storage.

The mutual coupling effect, which may include effects due to reflections, dynamic coupling between individual antenna elements across the array, and the DUT proximity effect, may be accounted for using methods described herein. As well, the finite scanner size is accounted for using methods well known in the art. Computations are performed to compute various models and their NF corrections. Far-field radiation pattern and radiated power of the antennas can be measured and studied by measuring near-field radiation [Johnson J. H. Wang, "An Examination of the Theory and Practices of Near-field Measurements," *IEEE Trans. Antennas Propagat.*, Vol. 36 pp. 746-753, January 1986].

Figure 6:
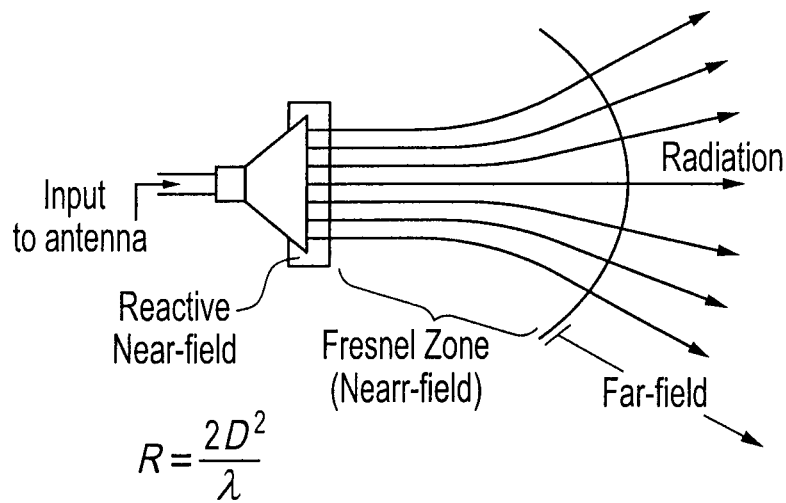
FIG. 6 shows a schematic depiction of the exterior fields of a radiating antenna.

FIG. 6 depicts the exterior fields of a radiating antenna, which are commonly divided into three regions: reactive near-field region, radiating near-field region and far-field region. The reactive near-field is excited in a small volume, just beyond the antenna and accounts for the stored electric and magnetic energies around the antenna and attenuates very rapidly. The reactive near-field region is commonly taken to extend about $\lambda/2\pi$ from the surface of the antenna, although conventional near-field measurements use a distance of a wavelength ($\lambda$) or greater to minimize the system uncertainty [Arthur D. Yaghjian, "An Overview of Near-field Antenna Measurements," *IEEE Trans. Antennas Propagat.*, Vol. AP-34 pp. 30-45, January 1986.]

Conventional scanning techniques of near-field measurement of antennas are based on the plane-wave spectrum (PWS) representation of fields that can be found in publications of Whittaker and Watson [G. T. Whittaker and G. N. Watson, *Modern Analysis*, $4^{th}$ ed. London: Cambridge Univ. Press, 1927, ch. XVIII].

Figure 7:
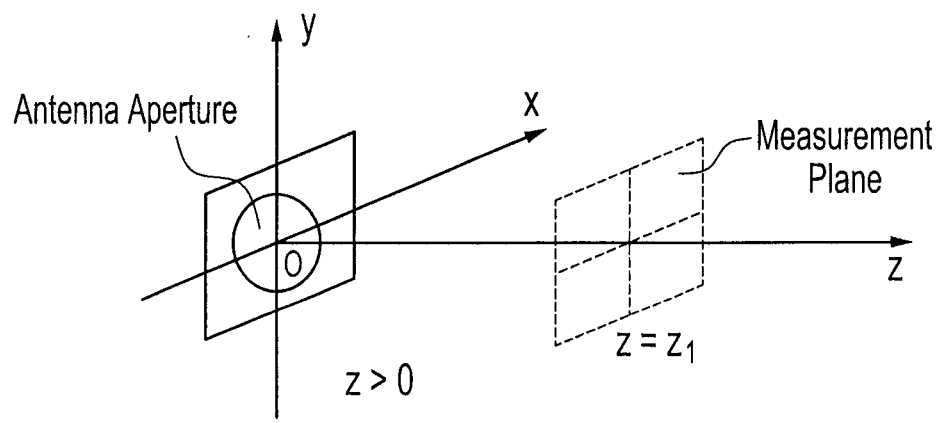
FIG. 7 shows a schematic depiction of the geometry of a planar near field measurement.

A planar near-field measurement system is depicted in FIG. 7. The aperture of the radiating antenna is in x-y plane of $z \leq 0$. The plane for near-field measurement is in x-y plane of $z=z_t$. Considering that the region of $z>0$ is source-free, the solutions to the time-harmonic electromagnetic field in front of the antenna aperture can be expressed as $$E(x,y,z) = \frac{1}{2\pi} \int_{-\infty}^{+\infty} \int_{-\infty}^{+\infty} A(k_x,k_y) e^{-jk \cdot r} dk_x dk_y \qquad (1)$$

$$H(x,y,z) = \frac{1}{2\pi} \int_{-\infty}^{+\infty} \int_{-\infty}^{+\infty} k \times A(k_x,k_y) e^{-jk \cdot r} dk_x dk_y \qquad (2)$$

with $k_x A_x(k_x,k_y) + k_y A_y(k_x,k_y) + k_z A_z(k_x,k_y) = 0$ (3)

where $k_x$ and $k_y$ are real variables and $k = k_x \hat{a}_x + k_y \hat{a}_y + k_z \hat{a}_z$ (4)

k may be called as wave number vector and $A(k_x,k_y)$ is called as the plane wave spectrum because the expression $A(k_x, k_y)e^{-jk \cdot r}$ in the integrants represents a uniform plane wave propagating in the direction k.

The equations are transformed and rearranged to express PWS $A(k_x, k_y)$ from Near-field using component $H(x, y, z)$ $$k_y A_z(k_x,k_y) - k_z A_y(k_x,k_y) = \qquad (5)$$
$$e^{jk_z z_t} \frac{1}{2\pi} \int_{-\infty}^{+\infty} \int_{-\infty}^{+\infty} H_x(x,y,z_t) e^{j(k_x x + k_y y)} dx dy$$

$$k_z A_x(k_x,k_y) - k_x A_z(k_x,k_y) = \qquad (6)$$
$$e^{jk_z z_t} \frac{1}{2\pi} \int_{-\infty}^{+\infty} \int_{-\infty}^{+\infty} H_y(x,y,z_t) e^{j(k_x x + k_y y)} dx dy$$

In the far-field zone of the antenna (kz>>1), based on the method of steepest descent, it can be shown that equation (1) can be represented by the asymptotic expansion [P. C. Clemmow, The Plane Wave Spectrum Representation of Electromagnetic Fields. London: Pergamon, 1966]

$$E(x,y,z) = \frac{je^{-jkr}}{r} k_z A(k_x,k_y) \qquad (7)$$

When planar near field scanning is performed on a radiating surface, due to the practical reasons and limitations, the scan has to be limited to a finite area in the x-y plane. Plane wave spectrum transformation may be applied on this scanned data to determine the far field properties of the radiating surface. The accuracy of the far field transformed data at a given frequency is limited by the finite area used for scanning. The data may be further processed in a post-processing module to improve the accuracy.

Conventional radiated power measurements are performed either in free space or in presence of huge ground plane. The far field data estimated using PWS provides estimates in free space. The data set is corrected to account for the ground plane interactions, as necessary.

Calculations of Power Density Pattern or Radiation Pattern, Directive Gain, Radiated Power and EIRP may be performed as follows:

$$U(\theta,\phi) = S(\theta,\phi)R^2 =$$

$$\frac{1}{2}\text{Re}(\vec{E} \times \vec{H}) \cdot \hat{r}R^2 = \frac{|E|^2 R^2}{2Z} = \frac{Z^2|H|^2 R^2}{2Z} = \frac{Z^2 k^2}{2Z}[(1-a_y)^2|M_x|^2 +$$

$$(1-a_x)^2|M_y|^2 + 2a_z a_y[(\text{Re}(M_x)\text{Re}(M_y) + \text{Im}(M_x)\text{Im}(M_y)]]$$

The $Z^2$ is taken out as $P_{offset}$, which will also takes other coefficient into account. In Matlab, PDS→U. Radiated power is obtained by integrating power density over the hemisphere. The hemisphere is divided into 50×100 pieces. And again, integration is carried out by summing the power density over the hemisphere.

For one complete scanning, the value can be obtained. If the scan is continued one after other, the quasi real time curve can be provided.

$$P_{rad} = \int_0^{2\pi} \int_0^{0.5\pi} U(\theta,\phi)\sin\theta \cdot d\theta d\phi$$

In the current implementation, $d\theta=1.8°$, $d\phi=3.6°$.

The power gain of an antenna in the direction specified by the spherical co-ordinates $(\delta,\phi)$ is defined as:

$$G_p(\theta,\varphi) = 4\pi \frac{U(\theta,\varphi)}{P_{in}}, \quad (30)$$

where $U(\delta,\phi)$, radiation intensity, is defined as "the power radiated from an antenna per unit solid angle" [C. A. Balanis, "Antenna Theory: Analysis and Design", Second Edition, John Wiley & Sons, 1997] in the direction $(\delta,\phi)$, and $P_a$ is the total power accepted by the antenna from the source. $P_{in}$ is computed from the voltage and current at the source as:

$$P_{in} = \frac{1}{2}\text{Re}(VI^*) \quad (31)$$

and $$U(\theta,\varphi) = \frac{1}{2}R^2\text{Re}(E \times H^*) = \frac{|E|^2 R^2}{2\eta} \quad (32)$$

E is obtained from equation (28) with r in the direction $(\delta,\phi)$, and r=R. Directivity is similarly defined as:

$$D = 4\pi \frac{U(\theta,\varphi)}{P_{rad}}$$

where $P_{rad}$ is the total power radiated by the antenna, $$P_{rad} = P_{in} - P_{loss}$$

$$= \oiint_\Omega U d\Omega = \int_0^{2\pi} \int_0^\pi U\sin\theta d\theta d\varphi$$

and $P_{loss}$ is the total ohmic loss in the antenna.

If the direction is not specified, it implies the direction of maximum radiation intensity (maximum directivity) express as $$D_{max} = \frac{U_{max}}{U_0} = 4\pi\frac{U_{max}}{P_{rad}}$$

The Effective Isotropic Radiated Power (EIRP) is the apparent power transmitted towards the receiver, if it is assumed that the signal is radiated equally in all directions, i.e. as a spherical wave emanating from a point source. This power is given by:

$$EIRP=G_t \cdot P_t$$

$$=D \cdot P_{rad}$$

where:
Gt=gain of transmitter antenna,
Pt=power transmitted

EXAMPLES

The following examples are illustrative of the claimed invention, but not limiting thereof.

The typical accuracies realizable in the industry for gain and directivity using far field measurement techniques is of the order of +/−0.25 dB over the cell phone operating frequency ranges. To achieve the traceability, extensive electromagnetic numerical simulation were performed to realize similar far field accuracies by realizing and adjusting the numerical model parameters of the reference sources at the pre defined cell phone band frequencies. Using these simulations, the EIRP of the reference sources was found to be 29.66 dBm and 24.95 dBm with an accuracy of +/−0.3 dB at 1880 MHz and 836.4 MHz respectively. The near field amplitude and phase accuracies at very close distances were estimated from the near field data set derived from the far field simulations and found to be of the order of 0.30 dB and +/−5 degrees. Using the amplitude and phase data from the simulations a frequency and model sensitive NF correction factor was developed to calibrate the scanner system to +/−0.3 dB amplitude and +/−5 degree phase accuracies.

Figure 8A:
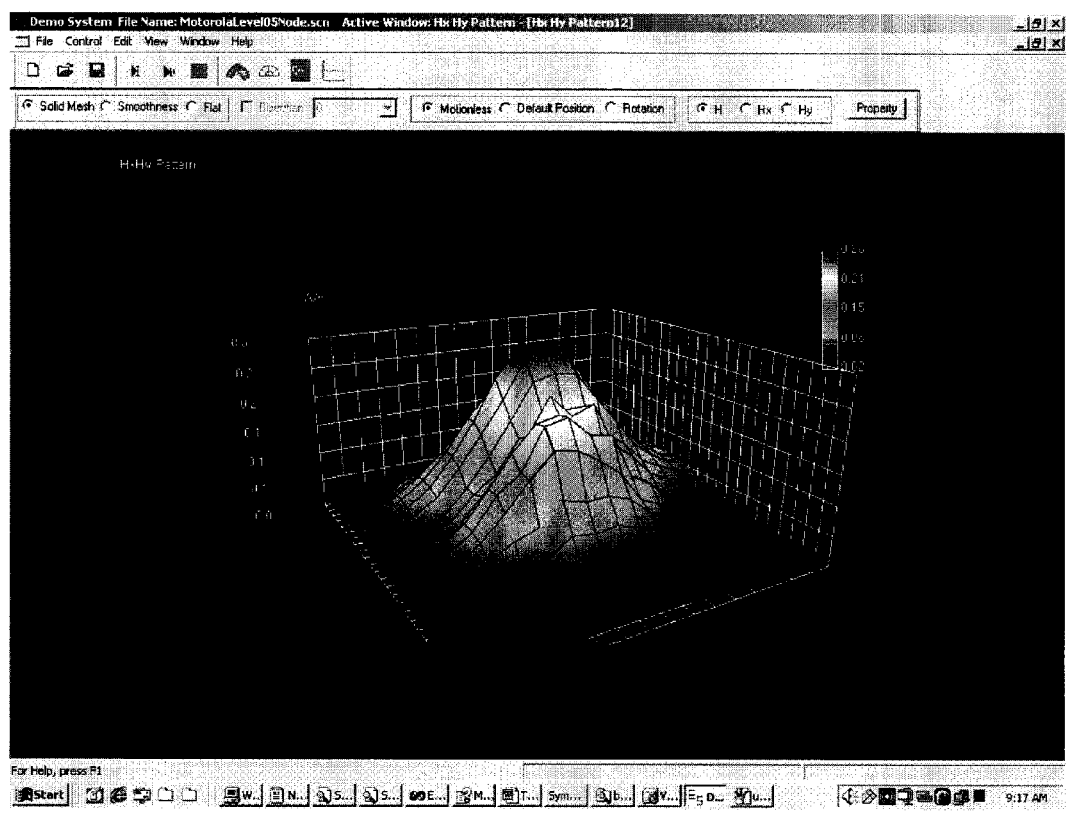
FIGS. 8A-8E show different screenshots of various displays produced by the graphical user interface of the processing engine.

FIG. 8A shows 3D near field total amplitude distribution of the radiating device under test. It is the resultant amplitude of the x and y magnetic filed intensities of the radiating device measured by each probe positioned at a predefined physical location.

Figure 8B:
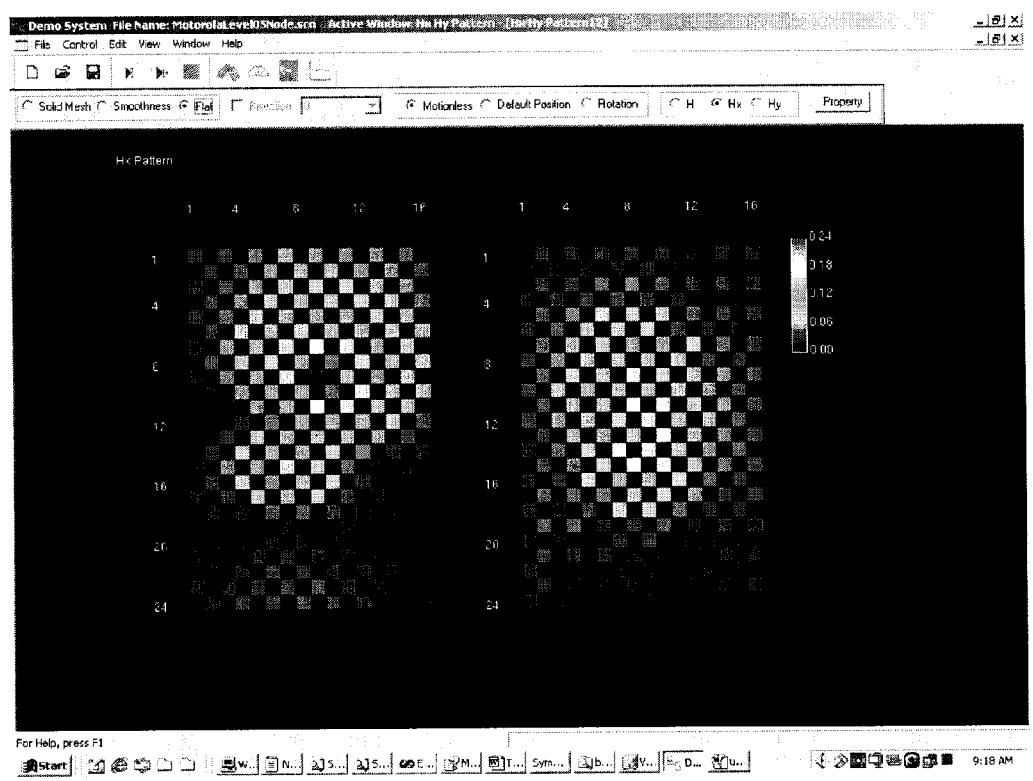

FIG. 8B shows 2D near field amplitude distribution of x and y components of the radiating device under test. It is the amplitude of the x and y components of magnetic filed intensities of the radiating device measured by each probe positioned at a predefined physical location.

Figure 8C:
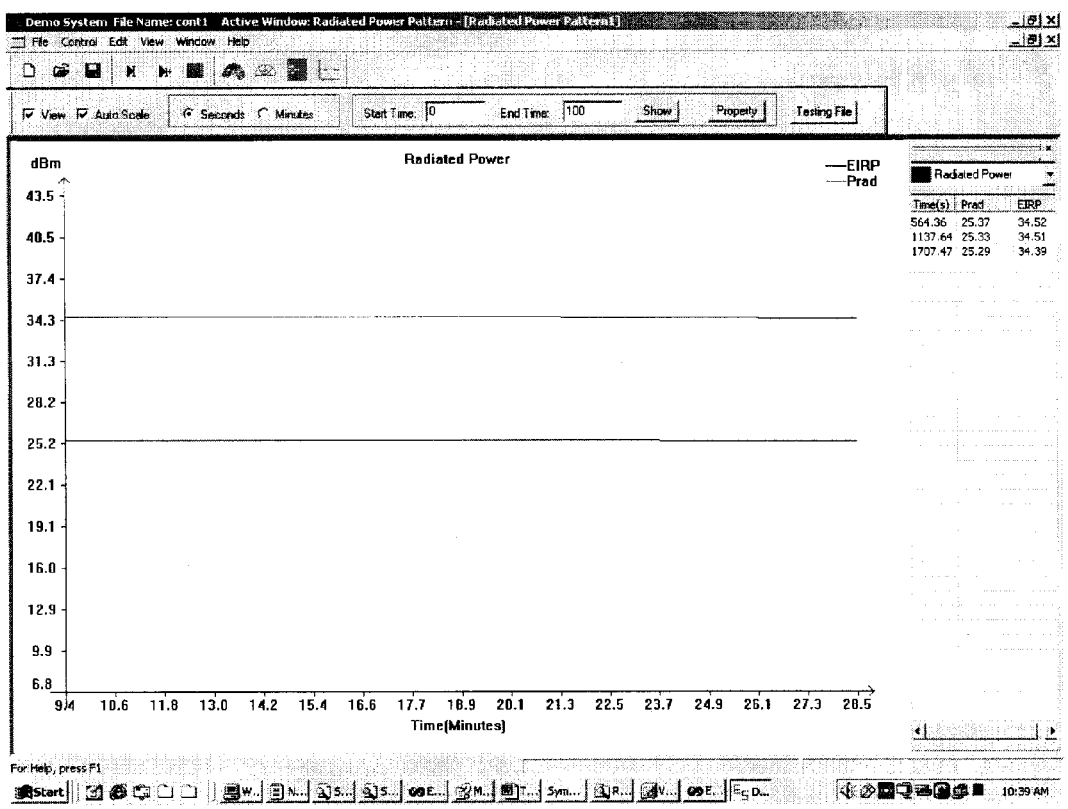

FIG. 8C shows the estimated value of EIRP, Directivity and Radiated Power (real time display) of the radiating device. The Radiated power is computed from the corrected near field amplitude and phase distribution as well as applying appropriate near field to far field transformations. The directivity and EIRP are computed further from the radiated power and computed radiation pattern of the radiating device.

Figure 8D:
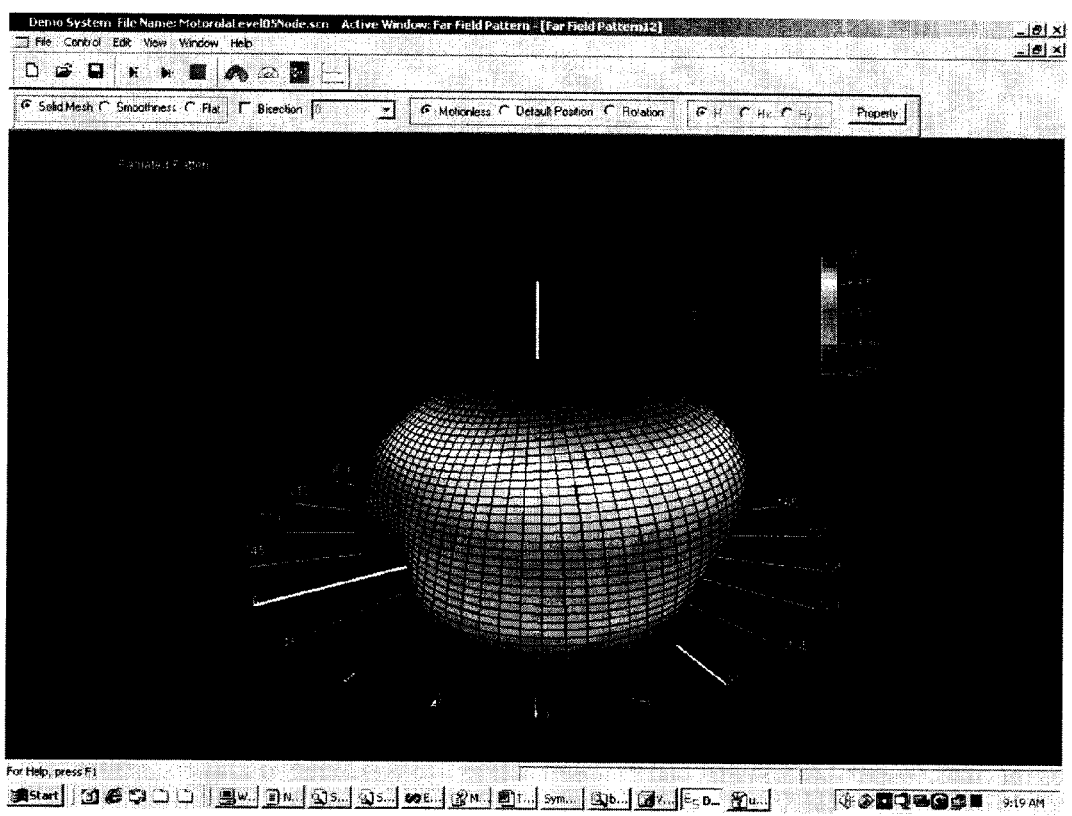

FIG. 8D shows 3D Hemispherical Radiation Pattern of the radiating device and is computed after applying the near field to far field transformations to corrected near field amplitude and phase distributions.

Figure 8E:
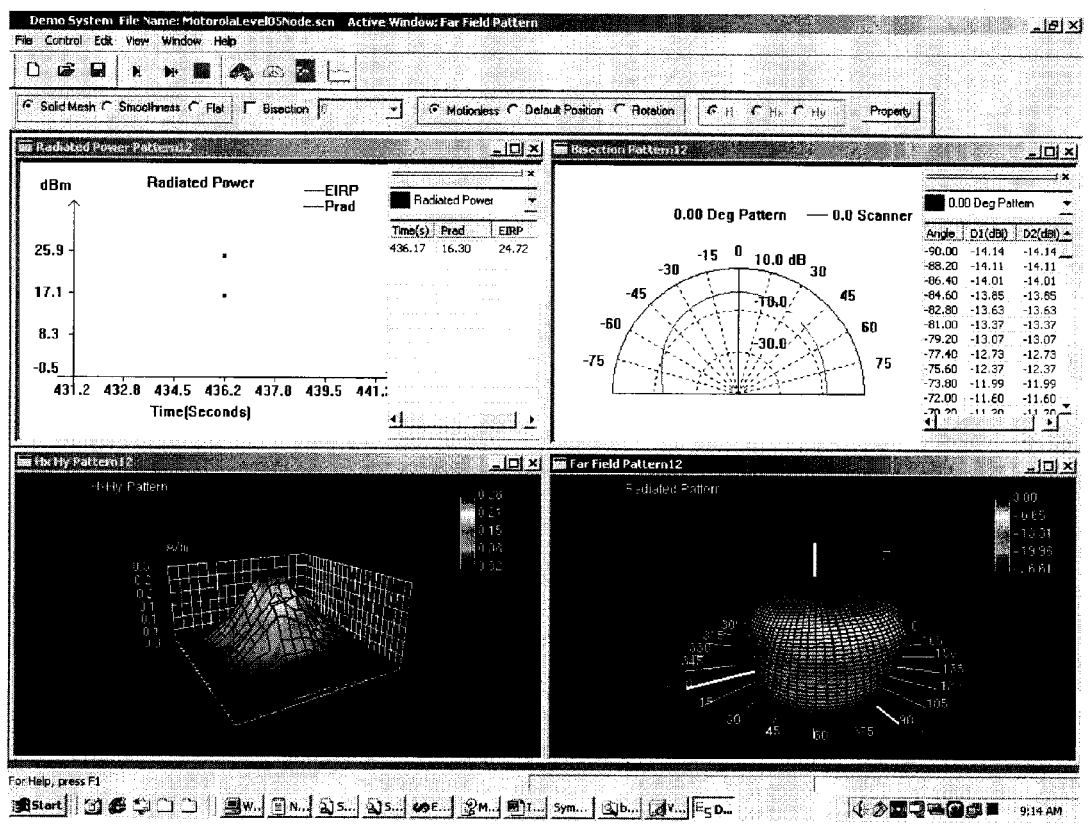

FIG. 8E shows an integrated GUI combining FIGS. 8A, 8B, 8C and 8D. Any on of these figures can be enlarged to show clearly the parameters that are being displayed. The displays showed in FIGS. 8A and 8B can be interchangeable by selecting appropriate options in the menu bar. The top right quadrant displays polar representation of the radiation pattern where the standard pattern of the device under test obtained from any test laboratory can also be super imposed on the computed radiation pattern of the scanner system.

As will be apparent to those skilled in the art, various modifications, adaptations and variations of the foregoing specific disclosure can be made without departing from the scope of the invention claimed herein. The various features and elements of the described invention may be combined in a manner different from the combinations described or claimed herein, without departing from the scope of the invention.

What is claimed is:

1. An absorberless near field microwave scanning system comprising:
    (a) a switched array of antenna elements embedded in a dielectric, for sensing electromagnetic field components at pre-determined locations, and forming an array surface, wherein said array outputs raw uncorrected signals which are indicative of the electromagnetic field and which include mutual coupling effects;
    (b) a scan surface for placement of the device under test (DUT), wherein the scan surface is substantially parallel to the array surface and separated by a distance less than about 1/1.8th of the wavelength of the measured frequency;
    (c) a processing engine operatively connected to the switched antenna array for obtaining and processing the array output, said processing engine adapted to correct at an individual probe level for mutual coupling effects, and said processing engine comprising:
        i. a controller,
        ii. a channel selector and sampler,
        iii. a channel corrector, to adjust for differential path losses and delays
        iv. a data translator and interpolator,
        v. an amplitude and phase detector,
        vi. a near field corrector,
        vii. a transformer for transforming the near field data to far field data, and
        ix. a user interface.

2. The system of claim 1 wherein the antenna elements are comprised in a multi-layer structure, and the antennas are isolated by means of ground vias through the multi-layer structure.

3. The system of claim 1 wherein the distance between the scan surface and the array surface (D) is between about 1/88th to about 1/1.8th of wavelength.

4. The system of any one of claims 1, 2 and 3 wherein the inter element distance (d) range of the array is between about 1/176th to about 1/3.6th of the wavelength.

5. The system of claim 4 wherein D/d is about 2.0.

6. The system of claim 1 wherein the processing engine is further adapted to account for finite scanner size.

7. A method of measuring and testing a performance parameter of an electromagnetic radiating device, said method comprising the steps of:
    (a) using a switched array of antenna elements forming a substantially parallel or non parallel array surface;
    (b) using this array scan surface, wherein the scan surface is substantially parallel to the array surface and separated by a distance less than about ½ wavelength of the measured frequency;
    (c) generating near field data by receiving output from the switched antenna array which is indicative of an electromagnetic field but includes mutual coupling effects;
    (d) correcting the near field data to correct at an individual probe level for mutual coupling effects; and
    (e) transforming the corrected near field data to far field data.

8. The method of claim 7 wherein the antenna elements are comprised in a multi-layer structure, and the antennas are isolated by means of ground vias through the multi-layer structure.

9. The method of claim 7 wherein the distance between the scan surface and the array surface (D) is between about 1/88th to about 1/1.8th of wavelength.

10. The method of claim 7 wherein the inter element distance (d) range of the array is between about 1/176th to about 1/3.6th of the wavelength.

11. The method of claim 7 wherein:
    (a) either the distance between the scan surface and the array surface (D) is between about $1/88^{th}$ to about $1/8^{th}$ of wavelength, or the inter element distance (d) range of the array is between about $1/176^{th}$ to about $1/3.6^{th}$ of the wavelength; and
    (b) D/d, is about 2.0.

12. The method of claim 7 wherein the mutual coupling effects corrected for include reflections and dynamic coupling effects between individual antenna elements across the array, and DUT proximity to scanner surface.

13. The method of claim 12 wherein the near field data is further corrected to account for finite scanner size.

* * * * *